(12) United States Patent
Huijsing et al.

(10) Patent No.: US 6,542,030 B2
(45) Date of Patent: *Apr. 1, 2003

(54) AMPLIFIER WITH STABILIZATION MEANS

(75) Inventors: Johan H. Huijsing, Schipluiden (NL); Klaas-Jan De Langen, Hoofddorp (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 09/966,670

(22) Filed: Sep. 28, 2001

(65) Prior Publication Data

US 2002/0063598 A1 May 30, 2002

Related U.S. Application Data

(62) Division of application No. 09/439,238, filed on Nov. 12, 1999, now Pat. No. 6,366,165.

(30) Foreign Application Priority Data

Nov. 16, 1998 (EP) .............................................. 98203856

(51) Int. Cl.[7] ................................................. H03F 3/45
(52) U.S. Cl. ........................ 330/252; 330/257; 330/292
(58) Field of Search ................................ 330/252, 257, 330/292, 294

(56) References Cited

U.S. PATENT DOCUMENTS

| 4,194,136 | A | * | 3/1980 | Butler | 307/296 R |
| 5,952,882 | A | * | 9/1999 | Kolluri | 330/255 |
| 5,966,050 | A | * | 10/1999 | Yoshino et al. | 330/255 |
| 6,084,475 | A | * | 7/2000 | Rincon-Mora | 330/255 |

* cited by examiner

Primary Examiner—Henry Choe
(74) Attorney, Agent, or Firm—John Vodopia

(57) ABSTRACT

An amplifier comprising an input stage ($IP_{ST}$) having a pair of inputs (INN,INI) for receiving a differential input signal ($V_{in}$) and a pair of outputs ($CQ_6, CQ_7$) for delivering a differential intermediate signal in response to the differential input signal ($V_{in}$); an intermediate stage ($INT_{ST}$) for converting the differential intermediate signal to a non-differential intermediate signal, which intermediate stage ($INT_{ST}$) comprises a current mirror ($Q_5, R_5, Q_4, R_4$) having an input branch ($Q_5, R_5$) and an output branch ($Q_4, R_4$) for receiving the differential intermediate signal; an output stage ($OP_{ST}$) having an input coupled to the output branch ($Q_4, R_4$) and having an output for delivering an output signal ($V_{out}$) to an output (OP) of the amplifier; and means for stabilizing the amplifier. The means for stabilizing the amplifier comprises a capacitor ($C_{M2}$) coupled between the output (OP) of the amplifier and the input branch ($Q_5, R_5$), and provides a large bandwidth and low supply voltage amplifier.

5 Claims, 14 Drawing Sheets

AMPLIFIER WITH STABILIZATION MEANS

CROSS REFERENCE TO RELATED APPLICATIONS

This is a divisional of U.S. patent application Ser. No. 09/439,238, filed Nov. 12, 1999, now U.S. Pat. No. 6,366,165, issued on Apr. 2, 2002.

BACKGROUND OF THE INVENTION

1. Field of the Invention

The invention relates to an amplifier comprising an input stage having a pair of inputs for receiving a differential input signal and a pair of outputs for delivering a differential intermediate signal in response to the differential input signal; an intermediate stage for converting the differential intermediate signal to a non-differential intermediate signal, which intermediate stage comprises a current mirror having an input branch and an output branch for receiving the differential intermediate signal; an output stage having an input coupled to the output branch and having an output for delivering an output signal to an output of the amplifier; and means for stabilizing the amplifier.

2. Description of Related Art

Such an amplifier is known from the general state of the art as shown in FIG. 1. The known amplifier has a first reference terminal $V_{EE}$ and a second reference terminal $V_{CC}$. A supply voltage source SV for biasing the amplifier is connected between the first reference terminal $V_{EE}$ and the second reference terminal $V_{CC}$. The known amplifier further comprises an input stage $IP_{ST}$, an intermediate stage $INT_{ST}$, and an output stage $OP_{ST}$. The input stage $IP_{ST}$ comprises a transistor $Q_6$ and a transistor $Q_7$, which are arranged as a differential pair. The bases of the transistors $Q_6$ and $Q_7$ are connected to a pair of inputs INN,INI to which a differential input signal $V_{in}$ is supplied. The emitters of the transistors $Q_6$ and $Q_7$ are connected to a current source $I_6$ for biasing the differential pair. The differential pair delivers a differential intermediate signal at the collectors $CQ_6$ and $CQ_7$ of the transistors $Q_6$ and $Q_7$, respectively. The intermediate stage $INT_{ST}$ has an input branch comprising a series arrangement of a resistor $R_5$ and a transistor $Q_5$. The transistor $Q_5$ is arranged as a diode. The intermediate stage $INT_{ST}$ further has an output branch comprising a series arrangement of a resistor $R_4$ and a transistor $Q_4$. The base of the transistor $Q_4$ is connected to the base of transistor $Q_5$. The input branch and the output branch are coupled between the first reference terminal $V_{EE}$ and the second reference terminal $V_{CC}$. The input branch and the output branch are biased by current sources $I_5$ and $I_4$, respectively. The output stage $OP_{ST}$ comprises a transistor $Q_2$ having a base coupled to the collector of transistor $Q_4$, an emitter coupled to the first reference terminal $V_{EE}$, and a collector coupled to the input of a current mirror $Q_3,Q_{13}$. The input of the current mirror $Q_3,Q_{13}$ is formed by a diode-connected transistor $Q_3$. The output of the current mirror $Q_3,Q_{13}$ is formed by the collector of the transistor $Q_{13}$. The base and emitter of the transistor $Q_{13}$ are coupled to the base and the emitter of the transistor $Q_3$, respectively. The transistor $Q_{13}$ is biased by a current source $I_3$. The output stage $OP_{ST}$ further comprises a transistor $Q_1$, which is biased by a current source $I_1$. A base of the transistor $Q_1$ is coupled to the collector of the transistor $Q_{13}$. A collector of the transistor $Q_1$ is coupled to the output OP of the amplifier to deliver an output signal $V_{out}$. An emitter of transistor $Q_1$ is coupled to the first reference terminal $V_{EE}$. Miller capacitors $C_{M1}$ and $C_{M2}$ for stabilizing the amplifier are coupled between the output OP and the base of transistor $Q_1$, and between the output OP and the base of transistor $Q_2$, respectively.

The principle of operation of the known amplifier as shown in FIG. 1 is as follows. The differential pair $Q_6,Q_7$ converts the differential input signal $V_{in}$ into currents of opposite phases, which are delivered by the collectors $CQ_6$ and $CQ_7$. The intermediate stage $INT_{ST}$ converts these currents into a single current, which is delivered by the collector of transistor $Q_4$. This single current is then amplified and converted by the output stage $OP_{ST}$ in order to deliver the output signal $V_{out}$ of the amplifier. In order to obtain a stable amplifier, the amplifier may include only one gain-stage with a so-called dominant pole and it may further include stages with non-dominant poles. If the Miller capacitors $C_{M1}$ and $C_{M2}$ are disregarded then the amplifier comprises in fact three gain stages, each with a dominant pole. The input stage $IP_{ST}$ and the intermediate stage $INT_{ST}$ form together a first gain stage with a first dominant pole at the collector of the transistor $Q_4$. The transistor $Q_2$ and the current mirror $Q_3,Q_{13}$ form together a second gain stage with a second dominant pole at the collector of transistor $Q_{13}$. The transistor $Q_1$ is a third gain stage with a third dominant pole at the output OP. The Miller capacitor $C_{M1}$ performs pole splitting, i.e. the third dominant pole becomes non-dominant while the second dominant pole becomes even more dominant. The Miller capacitor $C_{M2}$ also performs pole splitting, i.e. the first dominant pole becomes even more dominant while the second dominant pole becomes, in comparison with the first dominant pole, non-dominant. Thus, the amplifier has only one dominant pole at the collector of transistor $Q_4$. Therefore, the components of the amplifier can be dimensioned quite easily in order to obtain a stable operation of the amplifier. The Miller compensation technique for stabilizing the amplifier in the manner as shown in FIG. 1 is known as the nested Miller compensation technique since it comprises a first Miller loop formed by the transistor $Q_1$ and the Miller capacitor $C_{M1}$, and a second Miller loop formed by the transistor $Q_2$, the current mirror $Q_3,Q_{13}$ and the first Miller loop. Thus, the first Miller loop is nested within the second Miller loop. The function of the current mirror $Q_3,Q_{13}$ is to obtain a correct phase relationship within the second Miller loop.

A problem of the known amplifier is that the current mirror $Q_3,Q_{13}$ must handle a relatively large base current of transistor $Q_1$ and therefore the transistors $Q_3$ and $Q_{13}$ must have relatively large dimensions. In the quiescent state of the amplifier the current mirror $Q_3,Q_{13}$ is biased by a relatively small current so that the transit frequency of the current mirror $Q_3,Q_{13}$ is relatively low, which adversely influences the maximum bandwidth of the amplifier.

SUMMARY OF THE INVENTION

It is an object of the invention to provide an improved amplifier with an extended bandwidth.

To this end, according to the invention, the amplifier of the type defined in the opening paragraph is characterized in that the means for stabilizing the amplifier include a capacitor coupled between the output of the amplifier and the input branch of the intermediate stage.

The invention is based on the insight that the current mirror already available within the intermediate stage $INT_{ST}$ can also be used in a respective Miller loop to stabilize the amplifier as an alternative to the above-mentioned second Miller loop without causing a wrong phase relationship in the respective Miller loop. As a consequence, the current mirror $Q_3,Q_{13}$ is not necessary in the respective Miller loop. Therefore, the maximum bandwidth of the amplifier is extended.

In the general state of the art another solution is known for the above-mentioned problem caused by the current mirror $Q_3, Q_{13}$. The solution is the use of a differential stage in the output stage $OP_{ST}$ instead of the transistor $Q_2$ and the current mirror $Q_3, Q_{13}$. This solution, however, causes another problem: the differential stage cannot function properly at a low supply voltage. The amplifier according to the invention does not have a differential stage in the output stage $OP_{ST}$. Therefore, the amplifier according to the invention has a large bandwidth and can also function properly at a low supply voltage.

BRIEF DESCRIPTION OF THE DRAWINGS

The invention will be described in more detail with reference to the accompanying drawings, in which.

In these Figures parts or elements having like functions or purposes bear the same reference symbols.

DETAILED DESCRIPTION OF THE INVENTION

Figure 1:
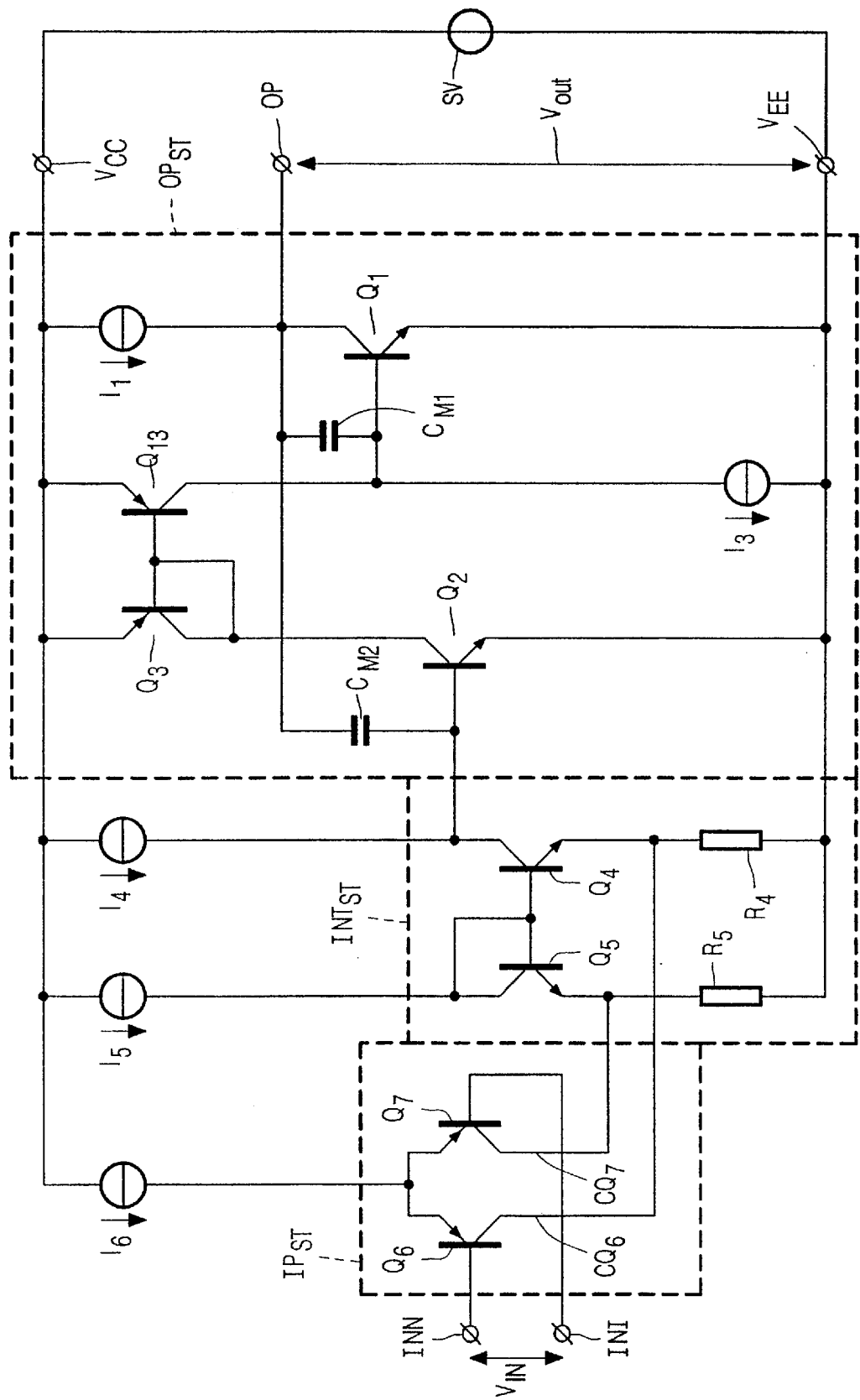
FIG. 1 is a circuit diagram of a known amplifier.
Figure 2:
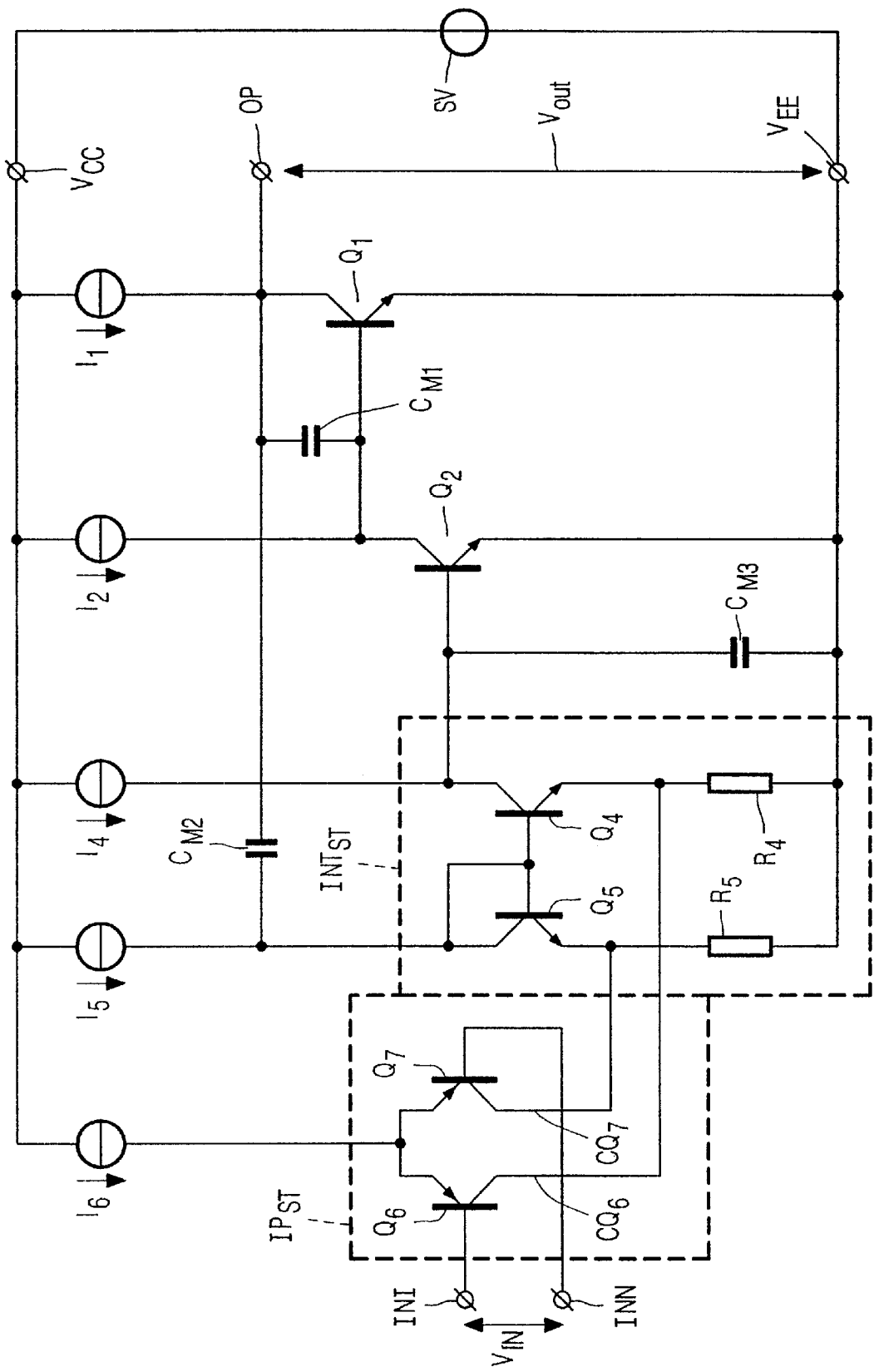
FIG. 2 is a circuit diagram of a first embodiment of an amplifier according to the invention.

FIG. 2 shows a circuit diagram of a first embodiment of an amplifier according to the invention. An important difference with the circuit of FIG. 1 is that the Miller capacitor $C_{M2}$ is connected to the input branch $Q_5, R_5$ of the intermediate stage $INT_{ST}$ instead of to the base of the transistor $Q_2$. As a consequence the current mirror $Q_3, Q_{13}$ in the known circuit of FIG. 1 is not necessary in the circuit of FIG. 2. Therefore, the collector of the transistor $Q_2$ is connected to the base of transistor $Q_1$. Thus, the intermediate stage $INT_{ST}$ has a double function: converting the differential intermediate signal from the collectors $CQ_6$ and $CQ_7$ into a non-differential signal at the collector of transistor $Q_4$, and functioning as a current mirror in a respective Miller loop with regard to the capacitor $C_{M2}$. The connection of the Miller capacitor $C_{M2}$ to the input branch $Q_5, R_5$ is, by way of example, made by connecting the Miller capacitor $C_{M2}$ to the base and the collector of the transistor $Q_5$. As an alternative, the capacitor $C_{M2}$ can be connected to the emitter of the transistor $Q_5$.

Although the Miller capacitor $C_{M2}$ creates a well defined dominant pole, the two non-dominant poles turn out to be complex, which might reduce the stability of the amplifier. This is caused by the fact that there is no capacitor connected to the base of transistor $Q_2$. Therefore, the base of transistor $Q_2$ is uncontrolled for high frequencies. The stability of the amplifier can be further improved if a capacitor $C_{M3}$ is arranged in parallel with the output branch $Q_4, R_4$. By way of example, the capacitor $C_{M3}$ is connected between the base of the transistor $Q_2$ and the first reference terminal $V_{EE}$. Since normally the first and the second reference terminal $V_{EE}, V_{CC}$ are decoupled, at least for high frequencies, the capacitor $C_{M3}$ may also be connected between the base of the transistor $Q_2$ and the second reference terminal $V_{CC}$. By the aforementioned decoupling the capacitor $C_{M3}$ is then also arranged in parallel with the output branch $Q_4, R_4$. The capacitor $C_{M3}$ slightly reduces the bandwidth of the amplifier, but this reduction can, at least partly, be avoided by inserting a resistor in series with the capacitor $C_{M3}$. The value of the capacitor $C_{M3}$ is not critical and must only be sufficient to avoid complex poles. The value of the capacitor $C_{M3}$ need not be matched to other capacitors. For this reason the capacitor $C_{M3}$ can be formed by a low-quality and compact capacitor such as a junction capacitor.

Figure 3:
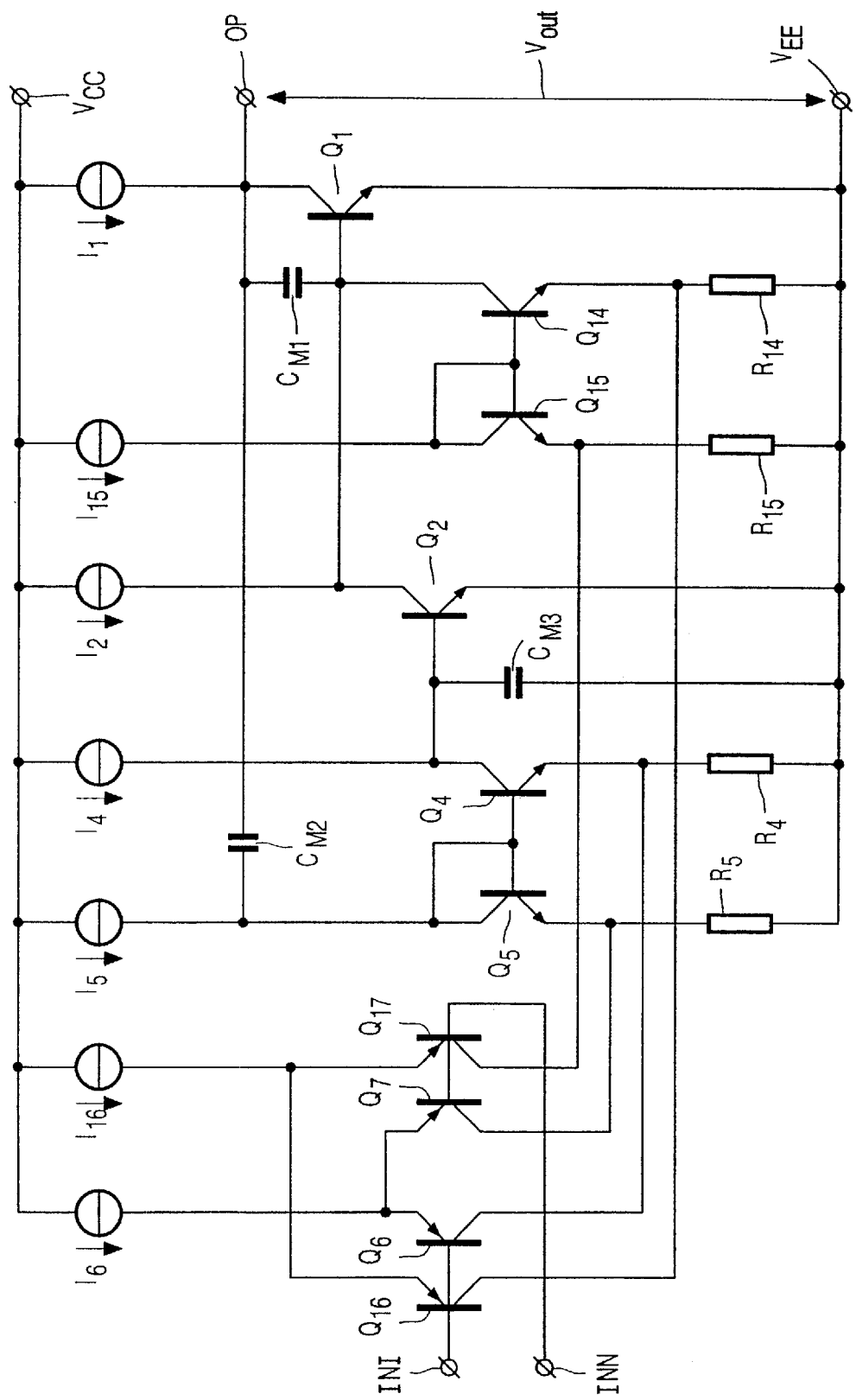
FIG. 3 is a circuit diagram of a second embodiment of an amplifier according to the invention.

FIG. 3 shows a circuit diagram of a second embodiment of an amplifier according to the invention. In comparison with the circuit of FIG. 2 the following components have been added: transistors $Q_{16}, Q_{17}, Q_{15}$, and $Q_{14}$; resistors $R_{15}$ and $R_{14}$; and current sources $I_{16}$ and $I_{15}$. These components are connected together in a manner similar to the transistors $Q_6, Q_7, Q_5$, and $Q_4$; the resistors $R_5$ and $R_4$; and the current sources $I_6$ and $I_5$. The elements of the following pairs have a mutually similar operation: $Q_{16}, Q_6$; $Q_{17}, Q_7$; $Q_{15}, Q_5$; $Q_{14}, Q_4$; $R_{15}, R_5$; $R_{14}, R_4$; $I_{16}, I_6$; $I_{15}, I_5$. The bases of the transistors $Q_{16}$ and $Q_{17}$ are, respectively, connected to the inverting input INI and the non-inverting input INN. The collector of transistor $Q_{14}$ is connected to the base of transistor $Q_1$. The function of the addition of the above-mentioned components is to form a low-gain and high-frequency path between the inputs INI,INN and the input of the output stage $Q_1$. This has the advantageous effect that the bandwidth of the amplifier is further enhanced significantly without the stability of the amplifier being reduced.

In order to obtain a higher low-frequency gain of the amplifier extra gain stages can be used in the output stage $OP_{ST}$. Naturally, also extra Miller capacitors are needed to stabilize the amplifier. In the known amplifier as shown in FIG. 1 the current mirror $Q_3, Q_{13}$ can be replaced by a so called common emitter stage (or a common source stage) because like the current mirror $Q_3, Q_{13}$ a common emitter stage also inverts the phase of a signal applied to it. Then there is no need to connect the capacitor $C_{M2}$ to the input branch $Q_5, R_5$. However, if it is desired to use an even number of extra gain stages instead of an odd number of extra gain stages, the current mirror $Q_3, Q_{13}$ cannot be removed because otherwise the phase relationship in the respective Miller loops would not be correct. However, the use of an amplifier according to the invention enables an even number of gain stages to be used without the current mirror $Q_3, Q_{13}$ being needed.

Figure 4:
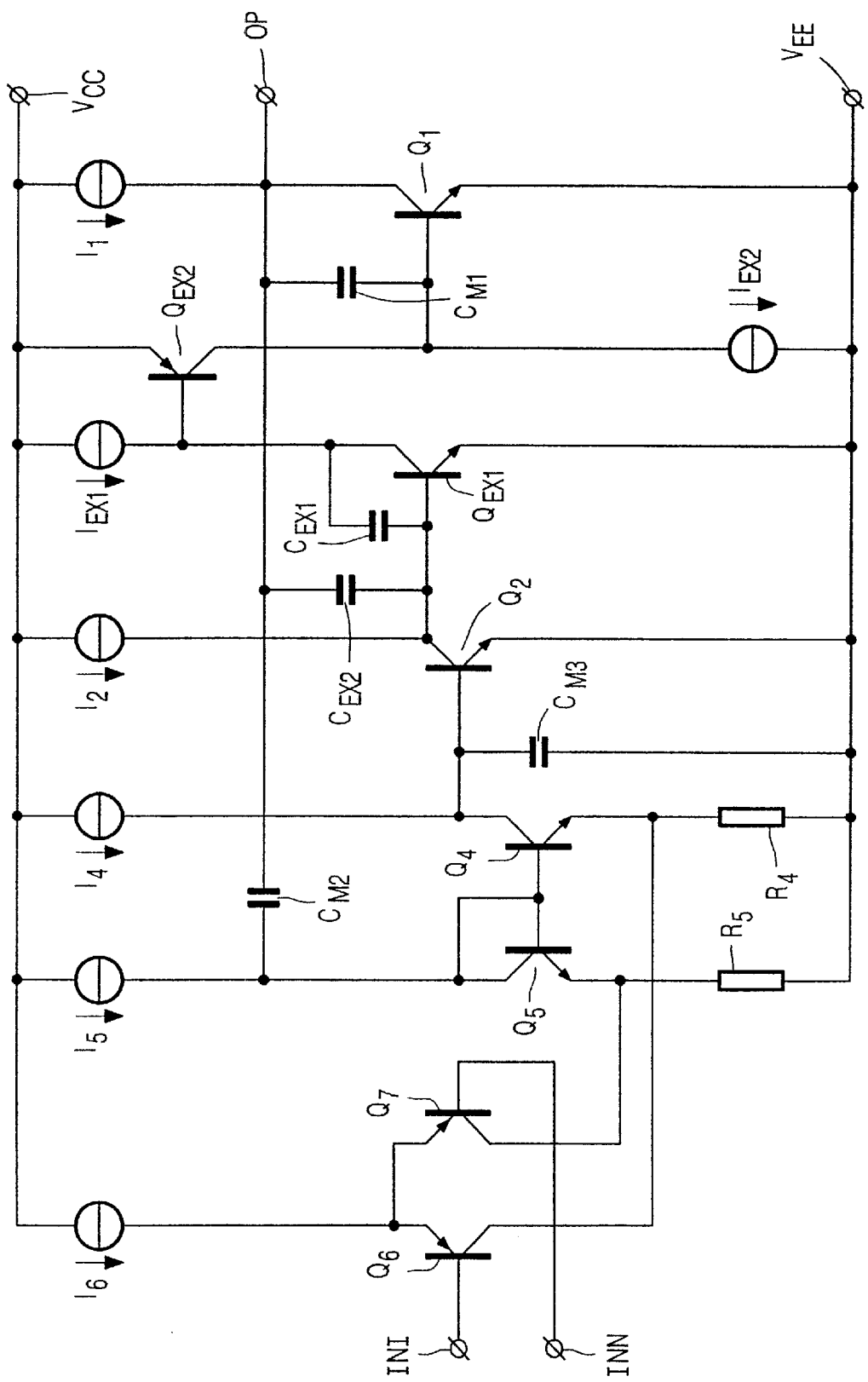
FIG. 4 is a circuit diagram of a third embodiment of an amplifier according to the invention.

An example of an even number of extra gain stages in the amplifier according to the invention is shown in FIG. 4. In this example two extra (common emitter) gain stages are used: a transistor $Q_{EX1}$ biased by a current source $I_{EX1}$, and a transistor $Q_{EX2}$ biased by a current source $I_{EX2}$. Also two extra capacitors $C_{EX1}$ and $C_{EX2}$ are added in order to stabilize the amplifier. The capacitor $C_{EX1}$ is connected between the base and the collector of the transistor $Q_{EX1}$, and the capacitor $C_{EX2}$ is connected between the output OP and the base of the transistor $Q_{EX1}$.

Figure 5:
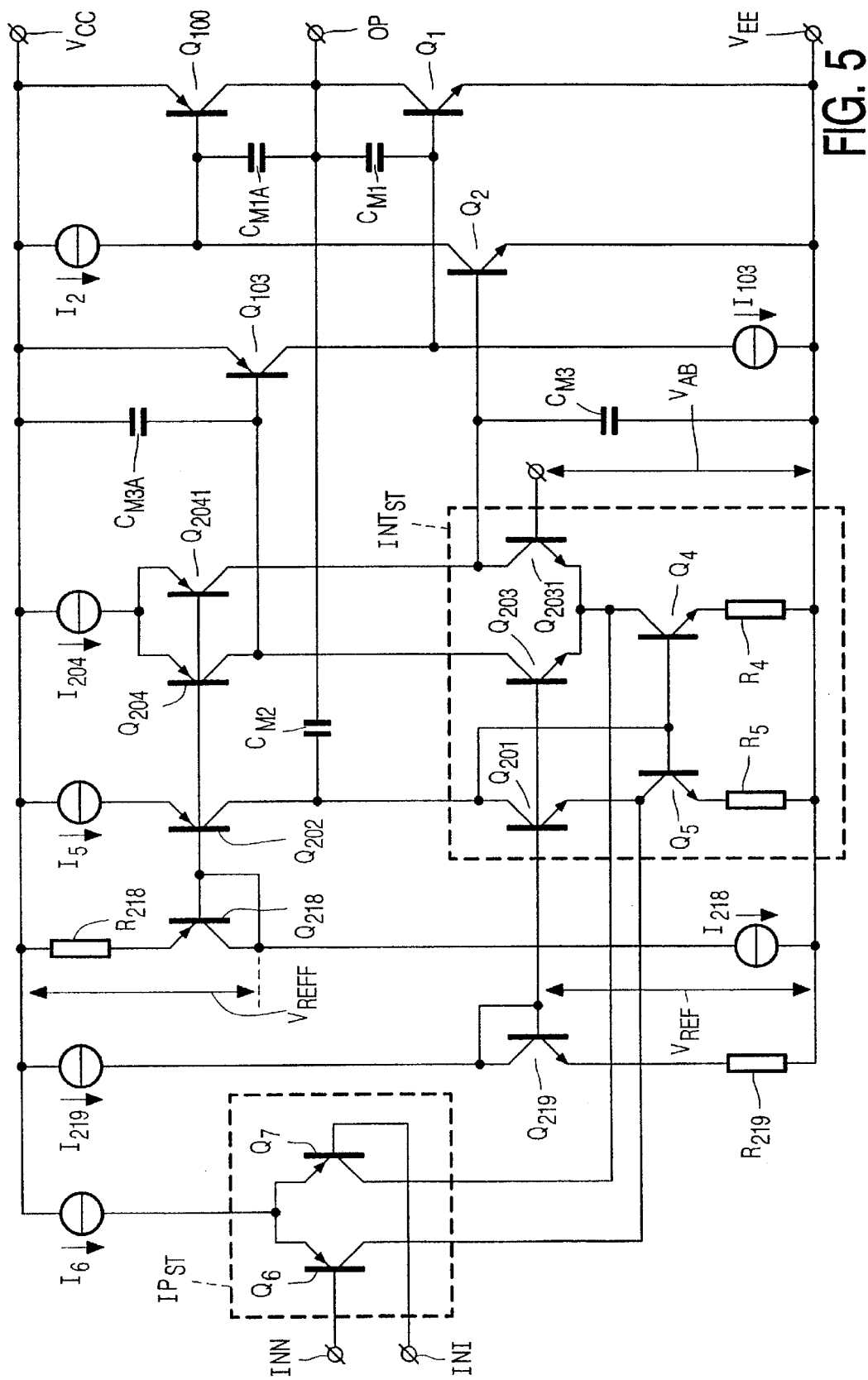
FIG. 5 is a circuit diagram of a fourth embodiment of an amplifier according to the invention.

FIG. 5 shows a circuit diagram of a fourth embodiment of an amplifier according to the invention. This embodiment is a variant of the circuit as shown in FIG. 2. The amplifier has a so called rail-to-rail output stage formed by the transistor $Q_1$ and a transistor $Q_{100}$. The amplifier further comprises a mesh formed by transistors $Q_{203}$, $Q_{204}$, $Q_{2041}$, and $Q_{2031}$. The mesh drives the transistors $Q_2$ and $Q_{103}$ with signals injected by transistors $Q_4$ and $Q_7$. The mesh can be controlled at the base of transistor $Q_{2031}$ by a control voltage $V_{AB}$ in order to obtain a feedback class AB biasing of the transistors $Q_1$ and $Q_{100}$. Capacitors $C_{M1A}$ and $C_{M3A}$ are added in order to stabilize the amplifier. Capacitor $C_{M1A}$ is connected between the output OP and the base of the transistor $Q_{100}$, while the capacitor $C_{M3A}$ is connected between the base and the emitter of the transistor $Q_{103}$.

Figure 6:
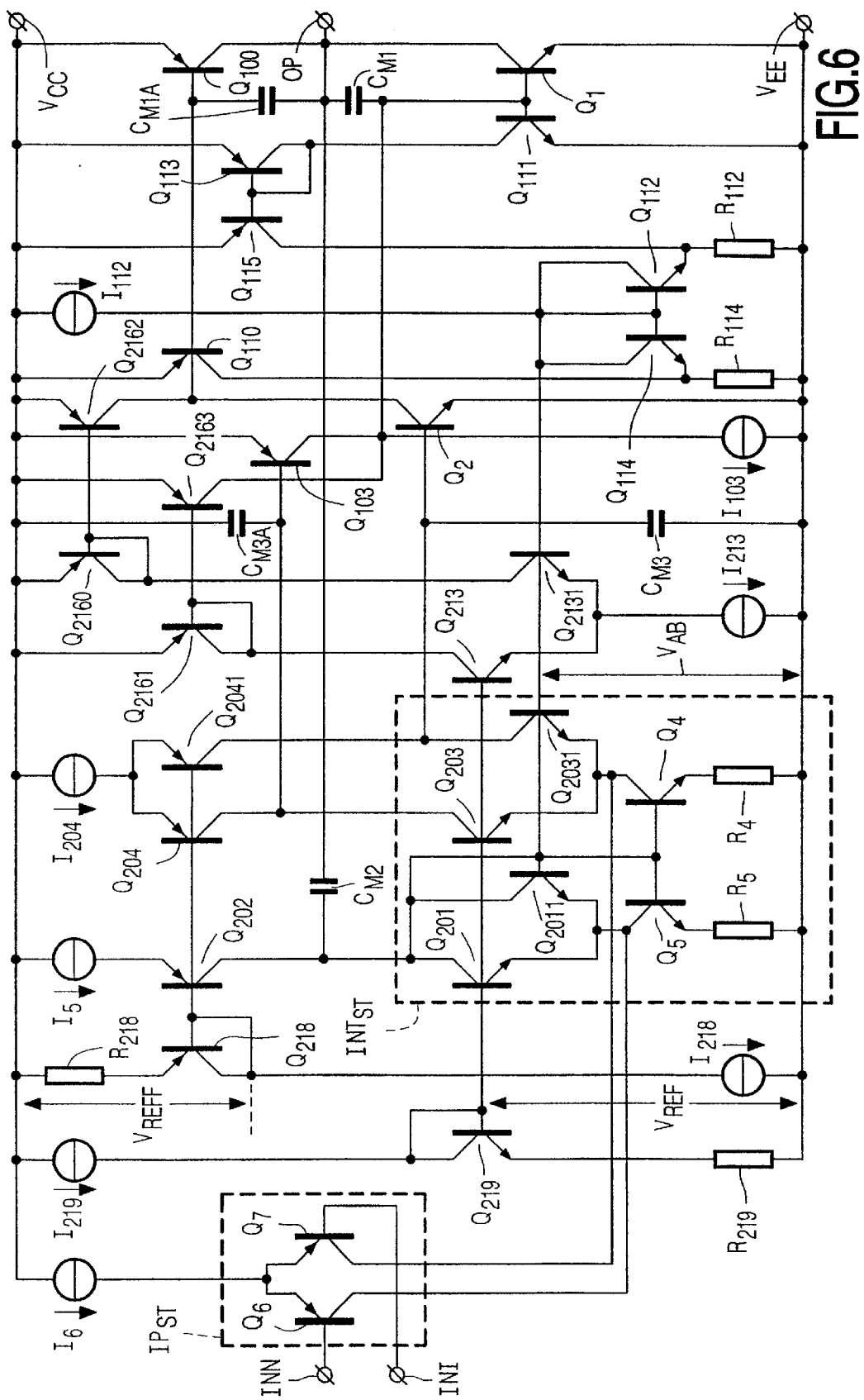
FIG. 6 is a circuit diagram of a fifth embodiment of an amplifier according to the invention.

FIG. 6 shows a circuit diagram of a fifth embodiment of an amplifier according to the invention. This embodiment is a variant of the circuit as shown in FIG. 5, i.e. that the amplifier has been provided with a class AB control circuit for supplying the control voltage $V_{AB}$. The class AB control circuit is formed by transistors $Q_{110}$, $Q_{111}$, $Q_{112}$, $Q_{113}$, $Q_{114}$, and $Q_{115}$, which drive the mesh. The transistor $Q_{110}$ measures, in an indirect way, the current through the transistor $Q_{100}$ and generates a voltage across a resistor $R_{114}$. The current of the transistor $Q_1$ is measured by the transistor $Q_{111}$ and is mirrored by the current mirror $Q_{113}$,$Q_{115}$, which as a consequence generates a voltage across a resistor $R_{112}$. The diode-connected transistors $Q_{112}$ and $Q_{114}$, form a selector for selecting the lower of the two voltages across the resistors $R_{112}$ and $R_{114}$. The control voltage $V_{AB}$ is thus derived from the lower of the two voltages across the resistors $R_{112}$ and $R_{114}$. Transistors $Q_{203}$ and $Q_{2031}$ form a class AB amplifier and create a class AB feedback loop by controlling the bases of the transistors $Q_{103}$ and $Q_2$, which drive the transistors $Q_1$ and $Q_{100}$. The voltage difference between the bases of the transistors $Q_{203}$ and $Q_{2031}$ is regulated to virtually zero. As a consequence, the control voltage $V_{AB}$ is equal to a reference voltage $V_{REF}$ across the series arrangement of a diode-connected transistor $Q_{219}$ and a resistor $R_{219}$. Since the transistor $Q_{219}$ and the resistor $R_{219}$ are biased by a current source $I_{219}$, the reference voltage $V_{REF}$, and as a consequence the control voltage $V_{AB}$, is determined by the current delivered by the current source $I_{219}$. The transistors $Q_1$ and $Q_{100}$ are controlled in such a way that they are biased with at least a certain minimum current. A feed forward path is used to stabilize the class AB feedback loop. The feed forward path is obtained by the use of a feed forward amplifier $Q_{213}$,$Q_{2131}$, which drives the transistors $Q_1$ and $Q_{100}$ via current mirrors $Q_{2161}$,$Q_{2163}$ and $Q_{2160}$,$Q_{2162}$.

Figure 7:
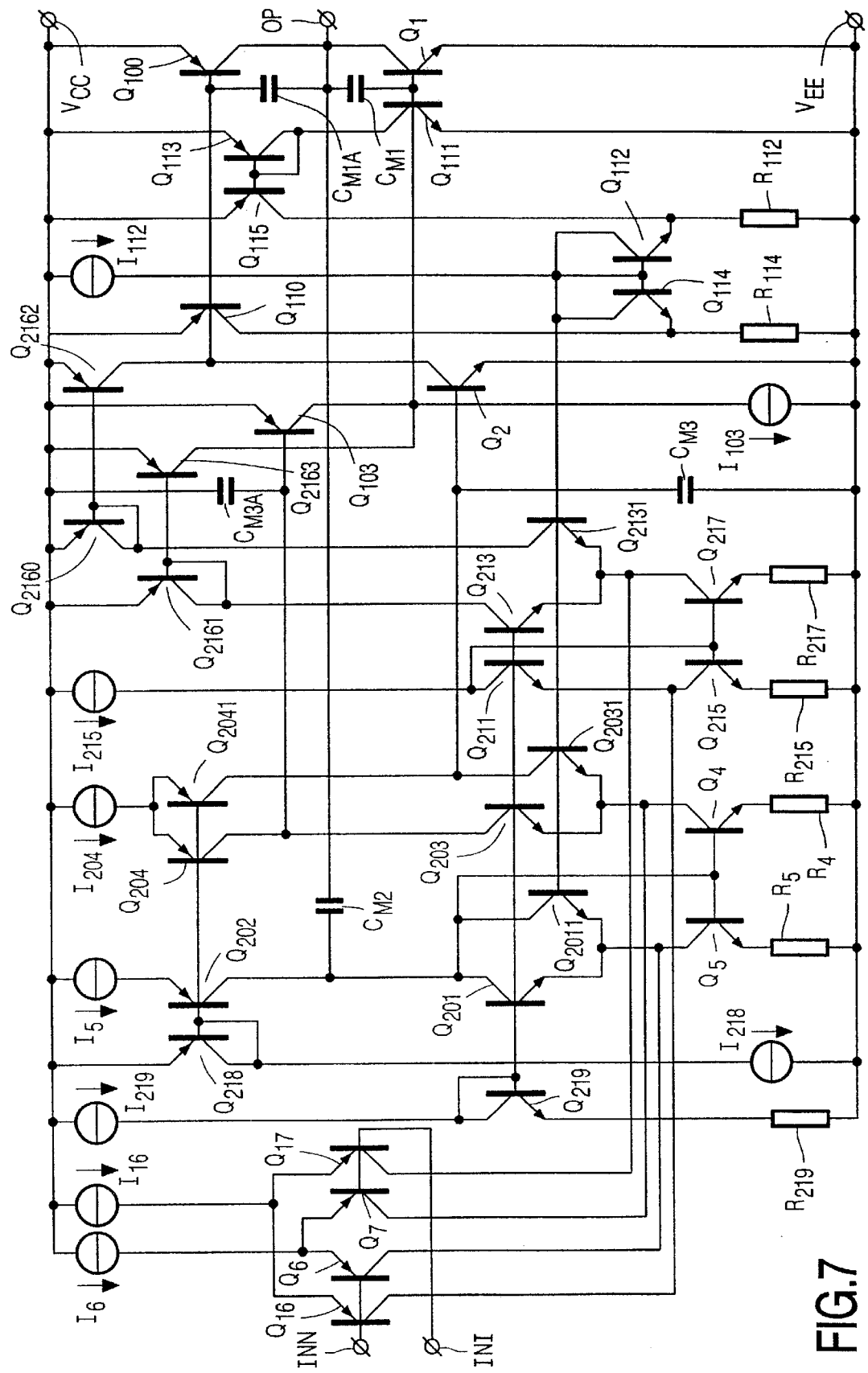
FIG. 7 is a circuit diagram of a sixth embodiment of an amplifier according to the invention.

FIG. 7 shows a circuit diagram of a sixth embodiment of an amplifier according to the invention. This embodiment is a variant of the circuit as shown in FIG. 6. In a manner similar to and for the same reason as stated with reference to in FIG. 3, a feed forward path, created by the transistors $Q_{16}$ and $Q_{17}$, is added. The output signals of the feed forward input stage $Q_{16}$, $Q_{17}$ are combined by a summing circuit formed by transistors $Q_{215}$ and $Q_{217}$ and resistors $R_{215}$ and $R_{217}$. The output current of the summing circuit is delivered by the transistors $Q_{217}$ and $Q_{17}$ and flows through the transistors $Q_{213}$ and $Q_{2131}$ and is used to drive the transistors $Q_1$ and $Q_{100}$ via the current mirrors $Q_{2161}$,$Q_{2163}$ and $Q_{2160}$, $Q_{2162}$.

Figure 8:
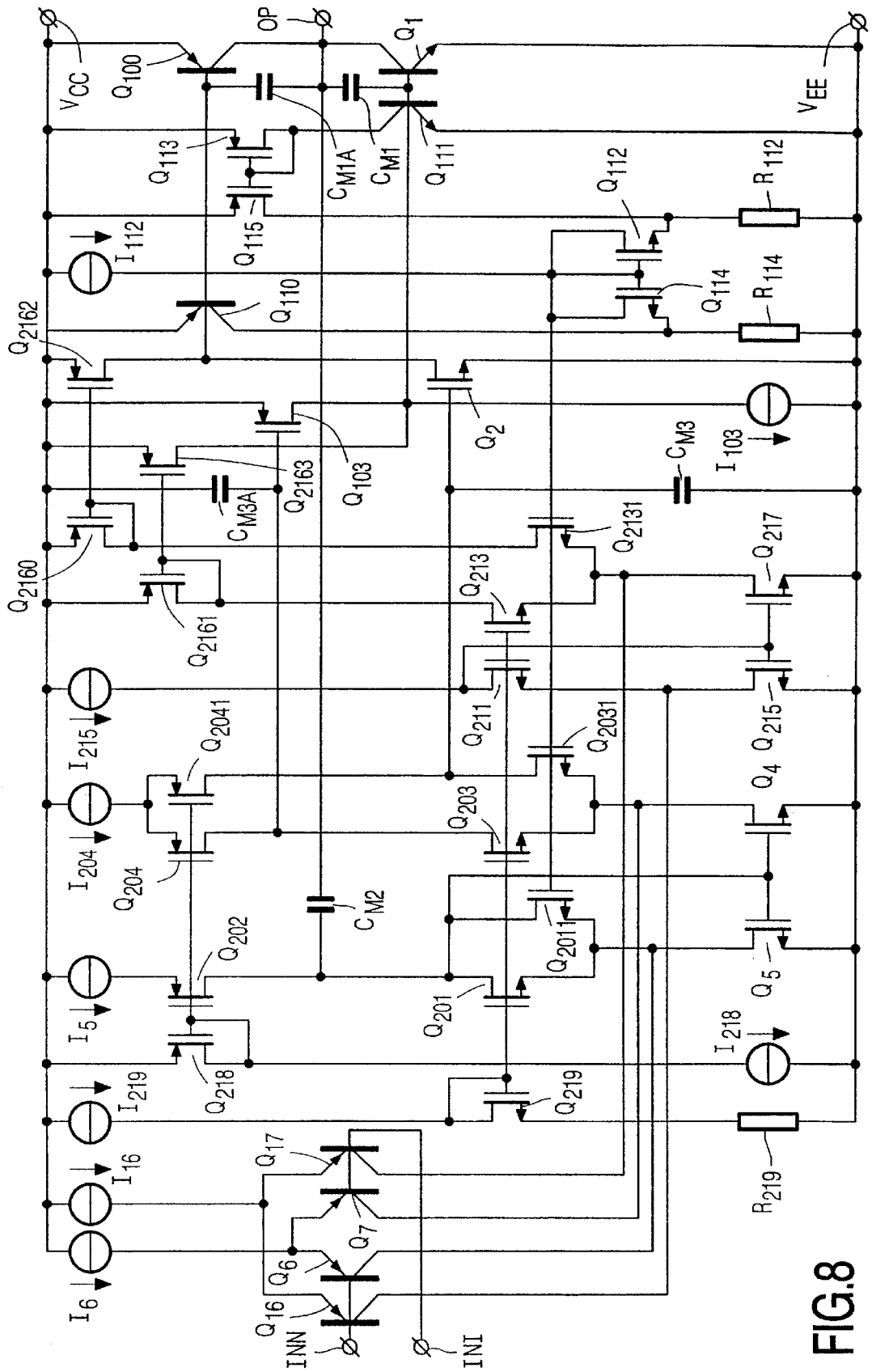
FIG. 8 is a circuit diagram of a seventh embodiment of an amplifier according to the invention.

FIG. 8 shows a circuit diagram of a seventh embodiment of an amplifier according to the invention. This embodiment is a so called BiCMOS version of the embodiment as shown in FIG. 7. The use of bipolar transistors and CMOS transistors gives the advantages of a high gain, a high bandwidth, a low input offset, and a high output current capability at the output OP. Though the resistors $R_5$, $R_4$, $R_{215}$, and $R_{217}$ as indicated in FIG. 7 are not necessary in the embodiment shown in FIG. 8 they may also be included in the embodiment shown in FIG. 8.

Figure 9:
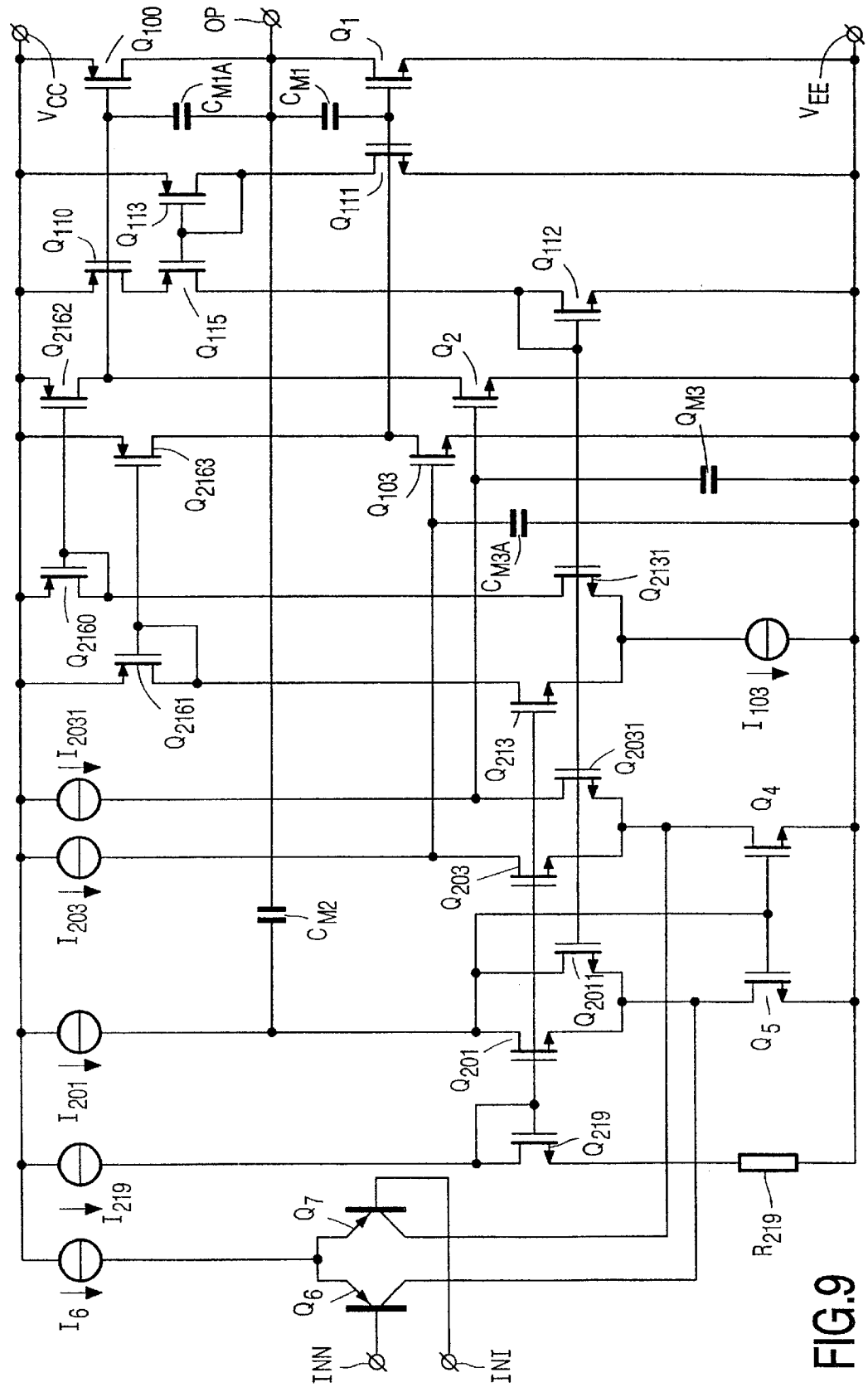
FIG. 9 is a circuit diagram of an eighth embodiment of an amplifier according to the invention.
Figure 10:
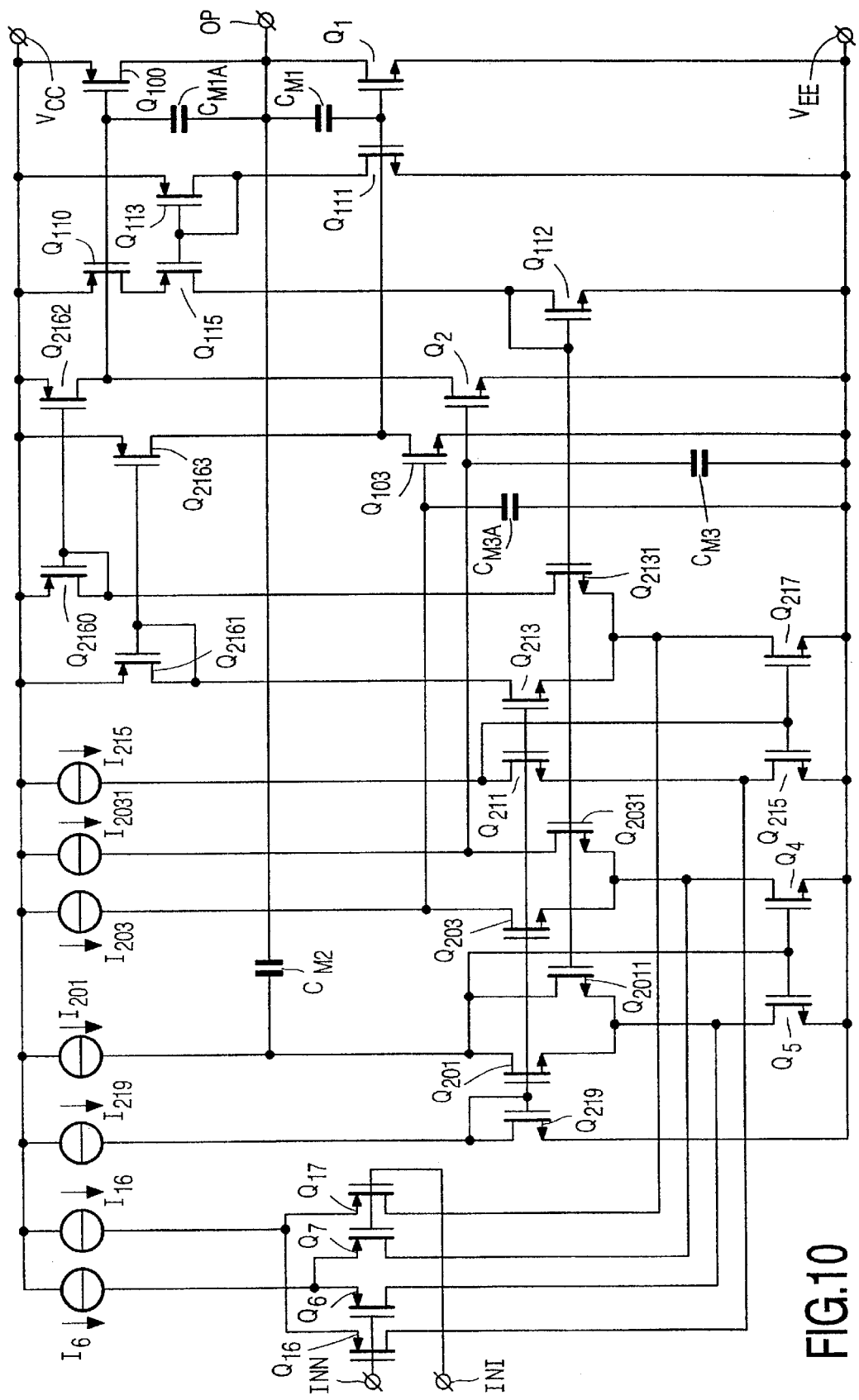
FIG. 10 is a circuit diagram of a ninth embodiment of an amplifier according to the invention.

FIGS. 9 and 10 show circuit diagrams of an eight and a ninth embodiment of an amplifier according to the invention. The topologies of these circuits are almost the same as those of the previously discussed circuits. However, an alternative for the class AB control circuit is provided by the arrangement of transistors $Q_{110}$–$Q_{115}$.

Figure 11:
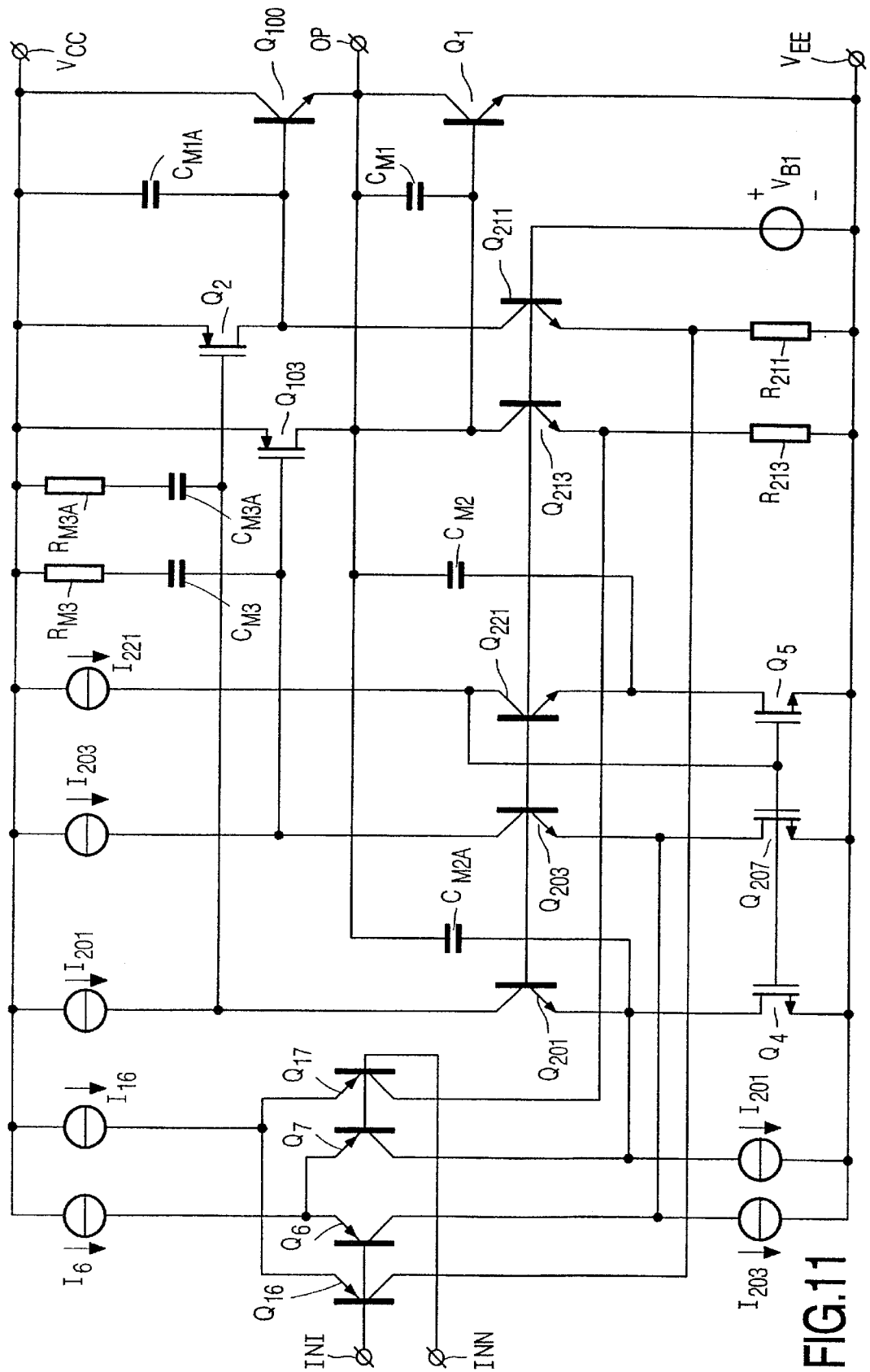
FIG. 11 is a circuit diagram of a tenth embodiment of an amplifier according to the invention.

FIG. 11 shows a circuit diagram of a tenth embodiment of an amplifier according to the invention. In this embodiment NPN transistors are combined with PMOS transistors. With this embodiment a very powerful circuit is obtained in BiCMOS technology. NPN transistors have usually a much better performance than PNP transistors. NPN transistors can handle much higher currents, have a higher current gain, and have a much higher transit frequency. PMOS transistors are the best complementary devices and also have a better performance than PNP transistors.

The transistors $Q_1$ and $Q_{100}$ form a so called all-NPN output stage. The NPN transistor $Q_1$ is driven by a PMOS transistor $Q_{103}$, while the NPN transistor $Q_{100}$ is driven by the PMOS transistor $Q_2$. The PMOS transistors $Q_2$ and $Q_{103}$ are driven by the PNP transistors $Q_7$ and $Q_6$ of the input stage $IP_{ST}$, via NPN cascode transistors $Q_{201}$ and $Q_{203}$. Since the NPN transistor $Q_{100}$ is arranged as a so called emitter follower, it does not invert signals. As a consequence, the combination of the PMOS transistor $Q_2$ and the NPN transistor $Q_{100}$ can be stabilized in conventional manners. The combination of the PMOS transistor $Q_{103}$ and NPN transistor $Q_1$ consists of two inverting stages and can therefore not be stabilized in a conventional way. It is therefore stabilized by capacitors $C_{M1}$ and $C_{M2}$. The capacitor $C_{M1}$ is connected between the output OP and the base of the NPN transistor $Q_1$. The capacitor $C_{M2}$ is connected between the output OP and the gate of the PMOS transistor $Q_{103}$ via the current mirror formed by the NMOS transistors $Q_5$ and $Q_{207}$ and the NPN transistors $Q_{221}$ and $Q_{203}$.

A feed forward path is created using NPN transistors $Q_{16}$ and $Q_{17}$ of the input stage $IP_{ST}$ in order to further extend the bandwidth of the amplifier.

Figure 12:
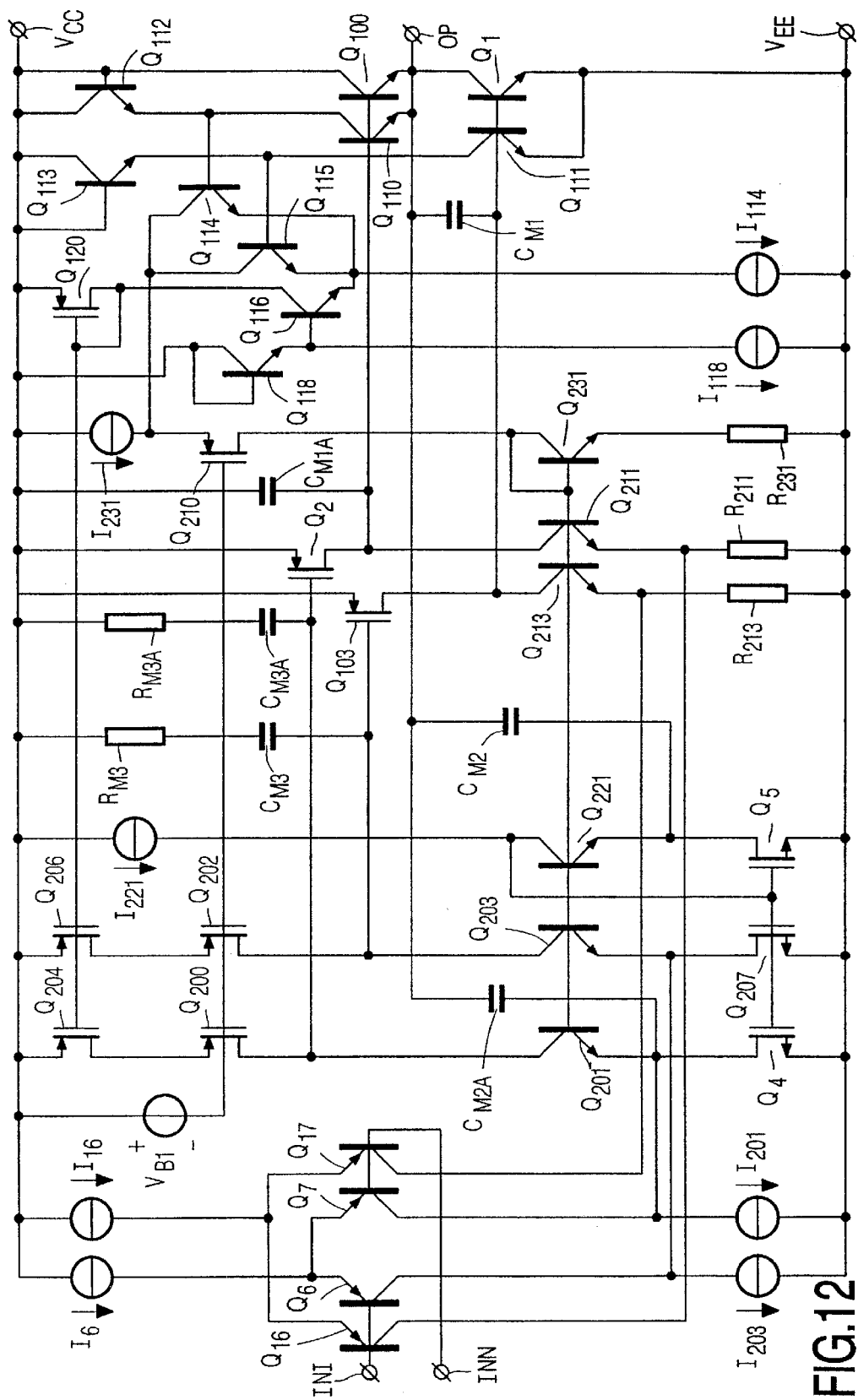
FIG. 12 is a circuit diagram of an eleventh embodiment of an amplifier according to the invention.

FIG. 12 shows a circuit diagram of an eleventh embodiment of an amplifier according to the invention. This embodiment is a variant of the embodiment as shown in FIG. 11. A class AB control circuit is added comprising NPN transistors $Q_{110}$–$Q_{118}$ in order to correctly bias the NPN transistors $Q_1$ and $Q_{100}$. A feed forward path for the class AB feedback loop is created by a PMOS transistor $Q_{210}$ and a current mirror comprising NPN transistors $Q_{231}$, $Q_{211}$, and $Q_{213}$, which current mirror directly drives the transistors $Q_1$ and $Q_{100}$.

Figure 13:
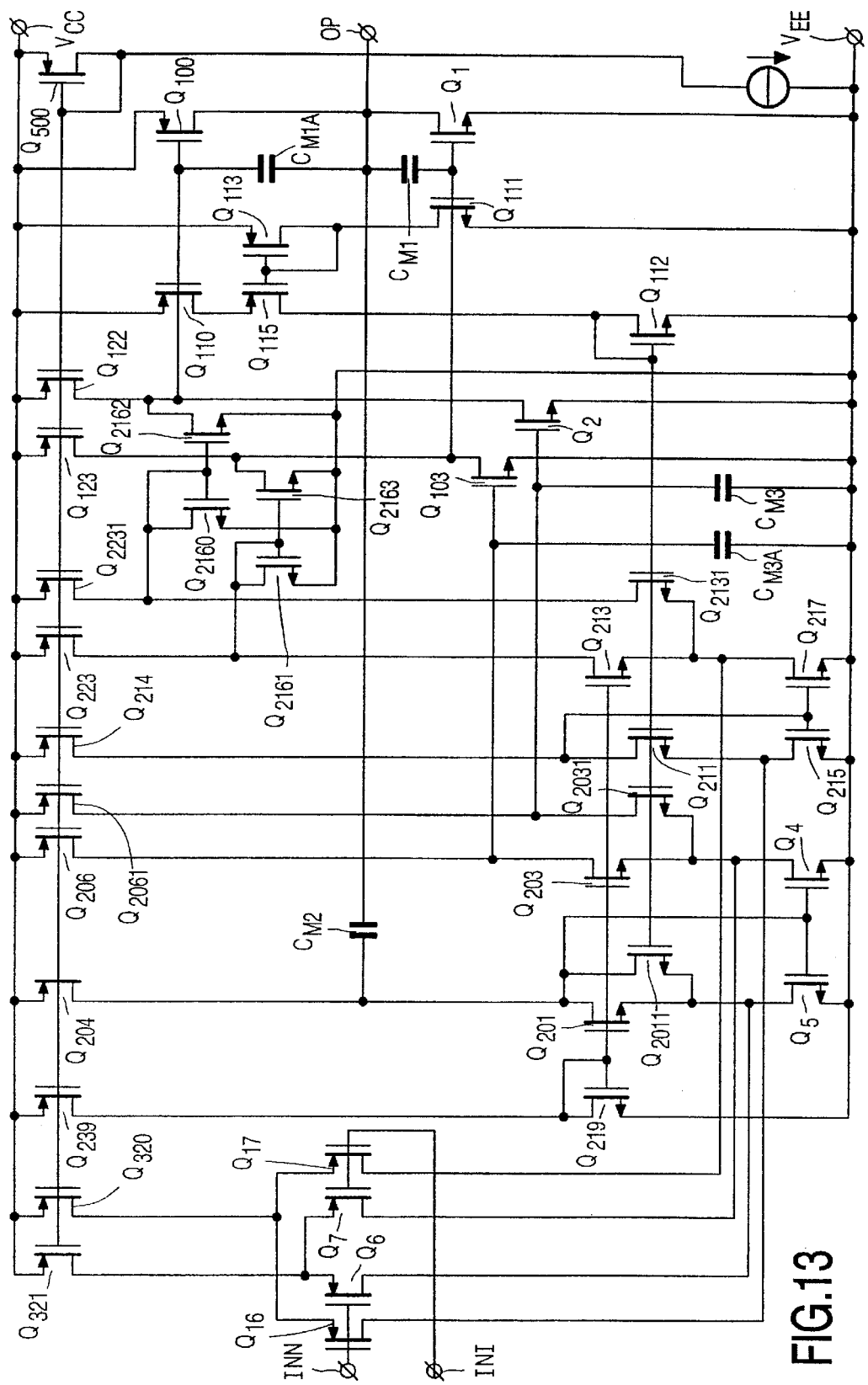
FIG. 13 is a circuit diagram of a twelfth embodiment of an amplifier according to the invention.

FIG. 13 shows a circuit diagram of a twelfth embodiment of an amplifier according to the invention. This embodiment is a variant of the circuits as shown in FIGS. 9 and 10. An important difference is that the current mirrors $Q_{2160}$,$Q_{2162}$ and $Q_{2161}$,$Q_{2163}$ are formed by means of NMOS transistors instead of PMOS transistors. By so doing a so called folded structure is obtained. This has the advantage that the amplifier can operate on an even lower supply voltage. A supply voltage equal to one gate-source voltage plus one saturation voltage is then sufficient.

Figure 14:
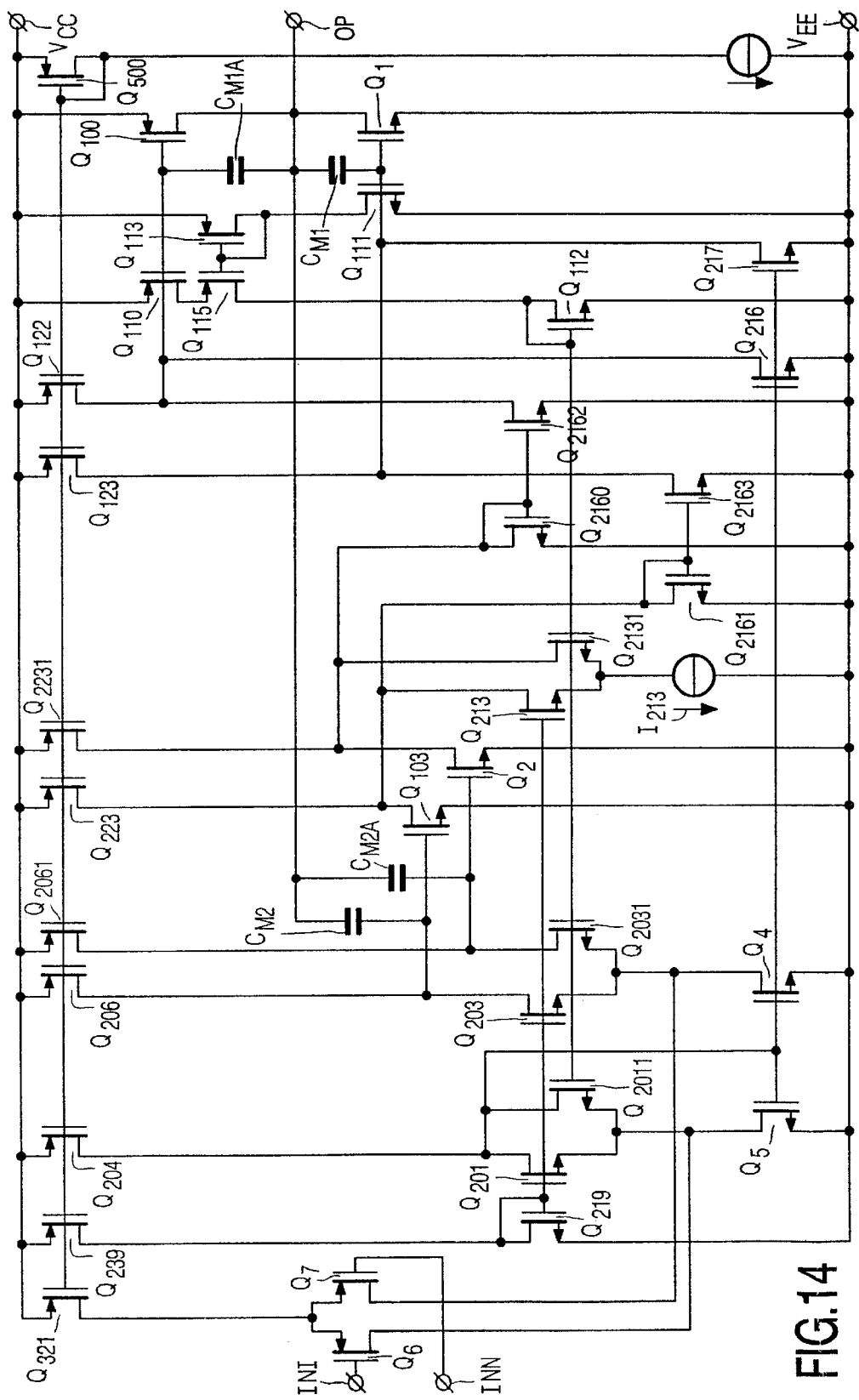
FIG. 14 is a circuit diagram of an amplifier with a modification in respect to the circuit diagram of FIG. 13.

FIG. 14 shows a circuit diagram of an amplifier which has been modified with respect to the circuit diagram of FIG. 13. The current mirrors $Q_{2160}, Q_{2162}$ and $Q_{2161}, Q_{2163}$ are now used not only by the feed forward path of the class AB control loop but also by the signals injected by the transistors $Q_2$ and $Q_{103}$.

We claim:

1. An amplifier comprising:
   an input stage having
      a pair of inputs for receiving a pair of differential input signals and
      a pair of outputs for delivering a pair of differential intermediate signals in response to the pair of differential input signals;
   an intermediate stage for converting the pair of differential intermediate signals to a single non-differential intermediate signal, said intermediate stage comprising a current mirror having an input branch and an output branch for receiving the pair of intermediate signals, and wherein only the output branch provides the single non-differential intermediate signal;
   a non-differential output stage having
      an input coupled to the output branch for receiving the single non-differential intermediate signal from the intermediate stage, and producing therefrom
      an output for delivering an output signal to an output of the amplifier; and
   a stabilizing circuit comprising a capacitor coupled between the output of the amplifier and the input branch of the intermediate stage.

2. An amplifier having a pair of differential input signals and an amplifier output comprising:
   an input stage configured to receive the pair of differential input signals and to produce therefrom a pair of differential outputs;
   an intermediate stage, operably coupled to the input stage, that includes an input branch and an output branch, wherein
      the input branch is configured to receive at least one of the pair of differential output signals from the input stage, and
      only the output branch is configured to provide a single non-differential output signal, based on the pair of differential output signals from the input stage;
   a non-differential output stage, operably coupled to the intermediate stage, that is configured to receive the single non-differential output signal from the output branch of the intermediate stage and to produce therefrom the amplifier output; and
   a feedback capacitor that is configured to couple the amplifier output to the input branch of the intermediate stage.

3. The amplifier of claim 2, wherein the non-differential output stage includes:
   an output device having an input node and an output node, the output node providing the amplifier output, based on a voltage at the input node, and
   a second capacitor that is configured to couple the output node to the input node of the output device.

4. The amplifier of claim 3, further including
   a third capacitor that is configured to couple the non-differential output to a supply voltage.

5. The amplifier of claim 2, further including
   an other capacitor that is configured to couple the non-differential output to a supply voltage.

* * * * *